(12) United States Patent
Srivastava et al.

(10) Patent No.: US 6,954,912 B2
(45) Date of Patent: Oct. 11, 2005

(54) ERROR DETECTION IN DYNAMIC LOGIC CIRCUITS

(75) Inventors: Pranjal Srivastava, Los Gatos, CA (US); Ajay Naini, San Jose, CA (US); Atul Dhablania, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 584 days.

(21) Appl. No.: 10/150,847

(22) Filed: May 17, 2002

(65) Prior Publication Data

US 2003/0217307 A1 Nov. 20, 2003

(51) Int. Cl.[7] ............................................. G06F 17/50
(52) U.S. Cl. ............................................. 716/4; 716/1
(58) Field of Search .................................. 716/1, 4

(56) References Cited

U.S. PATENT DOCUMENTS 6,195,788 B1 * 2/2001 Leaver et al. ................. 716/18
6,556,962 B1 * 4/2003 Patra ........................... 703/14
2003/0042933 A1 * 3/2003 Hill et al. ..................... 326/95

OTHER PUBLICATIONS

Srivastava, Pranjal, et al.; "Issues in the Design of Domino Logic Circuits"; Proceedings of the 8th Great Lakes Symposium on VLSI, Lafayette, Louisiana, U.S.A.; Feb. 19–21, 1998; pp. 108–112.

Wang, Zhongde, et al.; "Fast Address Using Enhanced Multiple–Output Domino Logic"; IEEE Journal of Solid-State Circuits, vol. 32, No. 2, Feb. 1997; pp. 206–214.

* cited by examiner

*Primary Examiner*—Matthew Smith
*Assistant Examiner*—Magid Y. Dimyan
(74) *Attorney, Agent, or Firm*—Fenwick & West LLP

(57) ABSTRACT

Error detection apparatus and methods for dynamic logic are provided. Circuit errors are detected by comparing true and complement signals to ensure they are in fact complementary signals. A pseudocomplement technique is used to implement an adder in which distinct logic cones generate the true and complement carry signals. Other embodiments comprising additional features, such as shared logic cone decomposition, are also provided.

28 Claims, 4 Drawing Sheets

ERROR DETECTION IN DYNAMIC LOGIC CIRCUITS

BACKGROUND OF THE INVENTION

1. Field of the Invention

This invention relates to error detection in logic circuits and, more particularly, to detecting errors in dynamic logic circuits.

2. Description of the Related Arts

Domino circuits have become popular in the design of high performance adders because they offer fast switching speeds and reduced areas. The use of conventional domino logic, however, introduces many design risks because it is very sensitive to circuit and to layout topologies and prone to circuit failures. This makes the detection and debugging of circuit failures difficult. Although simulation tests may be useful for debugging circuit behavior or logic, some problems that affect real-world circuit functionality, such as electrical coupling, often occur due to the particular circuit or layout topology used for the integrated circuit silicon implementation. Thus, a circuit may perform properly in simulation, but fail when implemented as an integrated circuit.

Dynamic logic circuits rely upon the storage of charge. Domino logic circuit design techniques are a well-known type of dynamic logic. In domino logic, there are generally two clocking operations: a precharge phase and an evaluation phase. During the precharge phase, the dynamic node is charged to $V_{DD}$ (positive supply voltage, logic "high" or logic "1" value). In the evaluation phase, a combinational logic function is evaluated, and the dynamic node is conditionally discharged to $V_{SS}$ (negative supply voltage or ground).

For a given set of inputs, if the function evaluates "true," then a path to $V_{SS}$ exists to discharge the dynamic node, thereby causing the static output inverter to drive the gate output to logic "1." For example, a 2-input AND gate outputs logic "1" when both inputs A and B are "true." That is, the function evaluates "true" when both A and B are logic "1" during the evaluation phase. If both A and B are not logic "1" during the evaluation phase, no path to $V_{SS}$ is created and the dynamic node has to maintain its stored state, which holds the gate output at logic "0."

In domino logic gates, one mode of circuit failure occurs when the dynamic node cannot be discharged to $V_{SS}$ as is required for proper gate evaluation. This type of failure, however, does not occur during normal operation of an integrated circuit that includes domino gates. Other tests performed on the integrated circuit reveal this problem before the integrated circuit is placed into normal operation, and faulty parts are appropriately sorted out. Another possible mode of circuit failure occurs when the dynamic node is not held at a logic "1" value. These failures occur for a variety of reasons, for example, charge sharing, noise on the input signals, or noise on the power rails can corrupt the state stored on the dynamic node. A charge sharing problem occurs when the charge that is stored at the dynamic node in the precharge phase is shared among the junction capacitance of transistors in the evaluation phase. Charge sharing may degrade the output voltage level and cause an erroneous output value. During the evaluation phase, the dynamic node cannot be recharged, and therefore the output stays at the erroneous value. In a functional unit such as an adder, misevaluation of a single gate can cause an error in the arithmetic result. See, e.g., Pranjal Srivastava, Andrew Pua, and Larry Welch, "Issues in the Design of Domino Logic Circuits," 8th GLS-VLSI, pp. 108–112, 1998 for further details of domino circuit failures.

Conventional techniques for detecting circuit errors include duplicating functional units and comparing the result of each functional unit. Figure ("FIG.") 1 is block diagram of a prior art functional unit error detection system and technique. This system includes a first adder 110, a second adder 120, and a comparator 130. The adders 110, 120 couple with the comparator 130. The comparator produces a functional unit error signal 140. As illustrated, the first adder 110 computes the addition of signals A and B, and the second adder 120 also computes the addition of signals A and B. The result of the first adder 110 and the result of the second adder 120 are compared by the comparator 130 to determine the functional unit error 140. That is, if the first adder 110 produces a different result from the second adder 120, then a circuit error has occurred with either the first adder 110 or the second adder 120.

Although duplicating functional units provides some additional integrity in the result, one problem with using duplicate functional units to detect errors is that some errors could be aliased. While transient errors (i.e., soft errors) can be detected with re-computation techniques, aliasing can cause duplicate functional units to produce an incorrect, but identical result. Such identically incorrect results would be undetected by the comparator 130. Therefore, including duplicated functional units does not necessarily provide absolute integrity or guaranteed validity in the result. Circuit design issues, layout issues, or electrical issues, such as coupling, contribute to this problem.

Another problem with using duplicate functional units to detect errors is the granularity of the error detection result. Detecting an error at the functional unit level does not provide much information to the circuit designer for debugging the error within the particular functional unit. The circuit designer does not know, for example, which circuits of the adder contributed to the erroneous result. Therefore, eliminating the errors is a difficult and time-consuming process.

A further problem with detecting errors in duplicate functional units is the additional hardware required. The area used by additional functional units and result comparators increases the integrated circuit chip footprint that could be allocated to other system functions. Moreover, the additional hardware increases heat generation that may cause circuit failures or require the use of more expensive cooling strategies. Conventional error detection techniques can alias the problems that occur in all the functional units, leaving the problem undetected. Further, in a conventional approach, if an error does get detected, debugging the circuit is often a long and tedious process because of the granularity of the error detection determination.

What is therefore needed is an apparatus and a method to detect reliably errors in domino logic circuits.

BRIEF SUMMARY OF THE INVENTION

An embodiment of the present invention provides error detection in dynamic logic circuits. In the domino type of dynamic logic, circuit failures occur because various conditions corrupt the state stored on the dynamic node. Adder designs implemented using domino logic require the true and complement form of most signals. Circuit errors are detected by comparing the true and complement signals to ensure they are in fact complementary signals. If the signals are not complementary, then a circuit error has occurred in one of the logic cones that produced the true and complement signals. A logic cone (or cone of logic) is comprised of the circuitry needed to evaluate an expression or implement a Boolean function. Ensuring that a true signal produced by a first logic cone is in fact the logical complement of a complement signal produced by a second logic cone detects errors because dynamic nodes can be discharged erroneously, but the dynamic node cannot be charged or be stuck at $V_{DD}$ (positive supply voltage, logic "high" or logic "1" value) erroneously without such a condition being detected by design-for-test (DFT) testing.

In an embodiment, a pseudocomplement technique is used to implement an adder in which distinct logic cones generate true and complement carry signals. When distinct logic cones implement the true and complement signals, no errors are aliased and comparing the true and complement signals detects when at least one error has occurred in one of the logic cones. Therefore, a circuit designer can locate where in the complex circuit an error occurred and address the problem.

In a further embodiment, circuit errors are detected in shared logic cones. A shared logic cone includes common or shared terms used in the generation of the true and complement signals. In a case of shared logic cones, circuit errors that occur in the shared or overlapping region of logic cones can be aliased. That is, comparing the logic cone that produces the true signal with the logic cone that produces the complement signal does not necessarily detect at least one circuit error. The shared logic cone is separately compared to detect errors within the shared region. One embodiment of error detection in a shared logic cone is decomposition of the shared region into distinct logic cones implementing true and complement signals. In another embodiment of error detection in a shared logic cone, the shared or common terms are one-hot, which means only one term can have a value of logic "1" at a given time. Therefore, verifying that common one-hot terms are in fact one-hot detects errors in the common logic of the shared logic cone.

Further features of the invention, its nature and various advantages will be more apparent from the accompanying drawings and the following detailed description.

BRIEF DESCRIPTION OF THE SEVERAL VIEWS OF THE DRAWINGS

The accompanying drawings, which are incorporated in and constitute a part of this specification, illustrate several embodiments in accordance with the present invention and, together with the description, serve to explain the principles of the present invention.

DETAILED DESCRIPTION OF THE INVENTION

The present invention is now described more fully with reference to the accompanying figures, in which several embodiments of the invention are shown.

Adders implemented using domino logic require the true and complement version of most signals to be generated. In an embodiment, a pseudocomplement technique is used to implement a carry lookahead adder for adding signals A and B where the true and complement signals are generated by distinct cones of logic. Signals A and B are, in an embodiment, both 64-bits wide, where a[i] represents the $i^{th}$ bit of A and b[i] represents the $i^{th}$ bit of B. One skilled in the art will appreciate that the principles described herein apply to signals of any bit width. A pseudocomplement design approach is described in Zhongde Wang et al., "Fast Adders Using Enhanced Multiple-Output Domino Logic," IEEE J. SOLID-STATE CIRCUITS, vol. 32, no. 2, pp. 206–214, 1997, which is incorporated by reference herein in its entirety. Using the pseudocomplement technique, the true carry-out of the $i^{th}$ bit position is generated by Equation 1, wherein g[i] the generate term is defined as Equation 2, and p[i] the propagate term is defined as Equation 3. One skilled in the art will appreciate that references herein to equations represent the logic circuitry that implements a function or logic expression. The true carry-in to the $i^{th}$ bit position is c[i−1].

$$c[i]=g[i]+p[i]c[i-1] \qquad \text{Equation 1}$$

$$g[i]=a[i]b[i] \qquad \text{Equation 2}$$

$$p[i]=a[i]+b[i] \qquad \text{Equation 3}$$

The complement of the carry-out of the $i^{th}$ bit position is generated by Equation 4, wherein k[i] the kill term is defined as Equation 5, and pcp[i] the pseudocomplement propagate term is defined as Equation 6. The complement carry-in to the $i^{th}$ bit position is $\overline{c}[i-1]$.

$$\overline{c}[i]=k[i]+pcp[i]\overline{c}[i-1] \qquad \text{Equation 4}$$

$$k[i]=\overline{a}[i]\overline{b}[i] \qquad \text{Equation 5}$$

$$pcp[i]=\overline{a}[i]+\overline{b}[i] \qquad \text{Equation 6}$$

Figure 1:
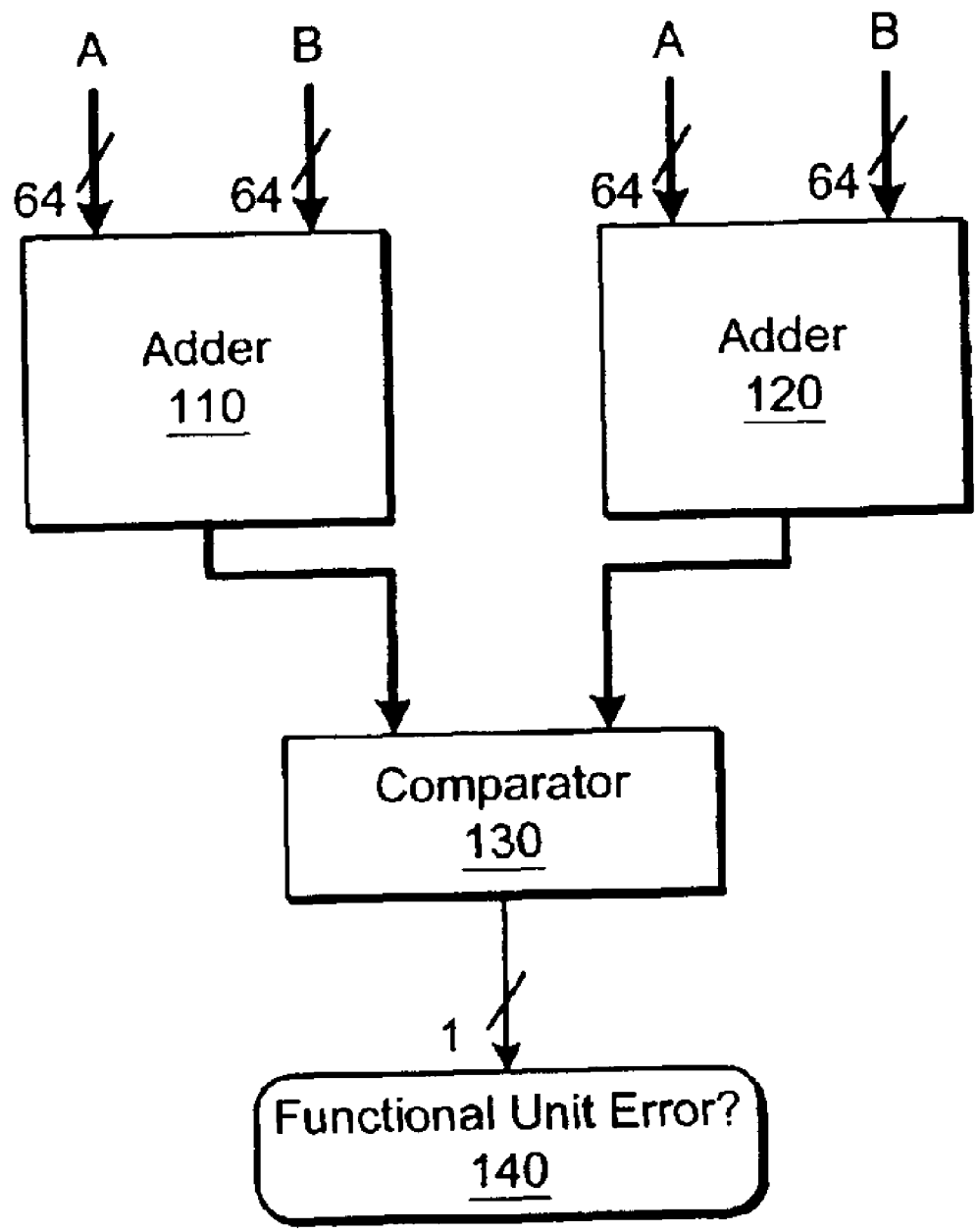
FIG. 1 is block diagram of a prior art functional unit error detection system and technique.
Figure 2:
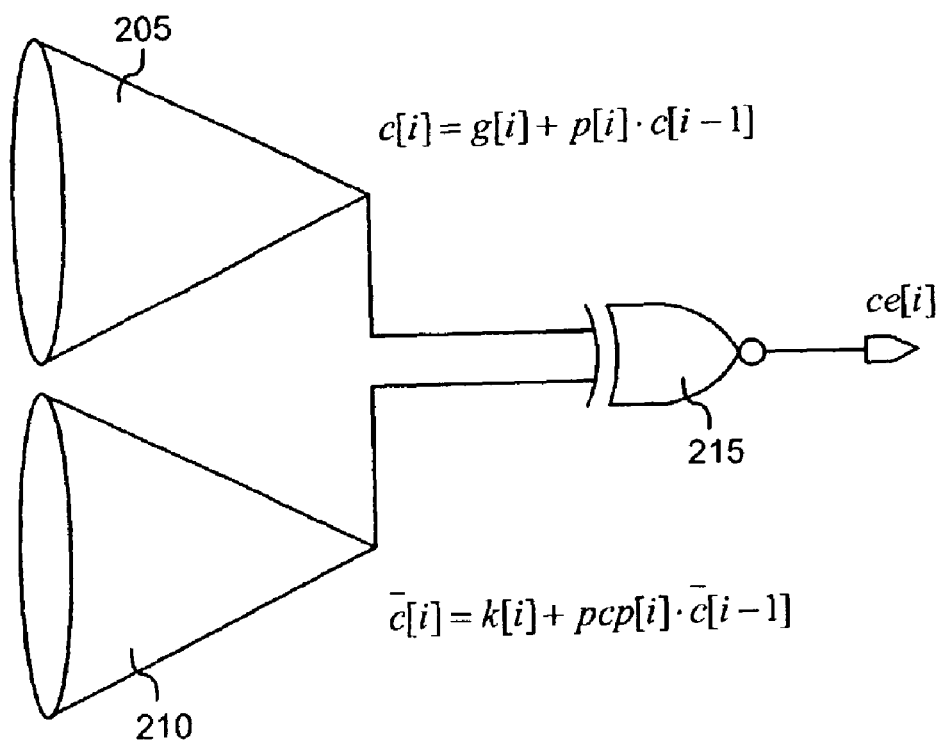
FIG. 2 is a diagram illustrating carry signal error detection using distinct cones of logic.

FIG. 2 is a diagram illustrating carry signal error detection using distinct cones of logic according to an embodiment of the present invention. The system includes a first logic cone 205, a second logic cone 210, and an exclusive-nor gate 215. The logic cones 205, 210 couple with the exclusive-nor gate 215. The output of the exclusive-nor gate 215 is a carry-error signal ce[i] for the $i^{th}$ bit position. The first logic cone 205 computes the true carry signal c[i] for the $i^{th}$ bit position according to Equation 1, and the second logic cone 210 computes the complement of the carry signal $\overline{c}[i]$ for the $i^{th}$ bit position according to Equation 4. A logic cone is comprised of the circuitry needed to evaluate an expression, for example, Equation 1. Depending on the function to be implemented, a logic cone comprises, for example, a single domino logic gate, a complex domino logic gate, or a plurality of domino logic gates cascaded or otherwise configured to implement the desired equation. By using the pseudocomplement technique, the logic cones that generate the true signal c[i] and the complement of the true signal $\overline{c}[i]$ are distinct. That is, there are no common terms or shared logic in the generation of the true and complement forms of the carry signal. Implementing true signal c[i] and the complement of the true signal $\overline{c}[i]$ in distinct logic cones ensures that all circuit errors are detected when the true and complement signals are compared. No circuit errors can be aliased when the logic cones are distinct.

In the embodiment illustrated in FIG. 2, the exclusive-nor gate 215 compares the true and complement carry signals to determine if they are in fact complements of each other. One skilled in art will recognize that the carry-error signal ce[i] is valid during the evaluation phase when the signals c[i] and $\bar{c}[i]$ have been evaluated. Comparing the evaluated values of the true signal c[i] and the complement of the true signal $\bar{c}[i]$ detects whether a circuit failure has occurred in either the first logic cone 205 or the second logic cone 210. If there are no errors in the logic cones, or the circuits themselves that produce these signals, the output of the exclusive-nor gate 215, the carry-error signal ce[i], is logic "0." However, if the output of the exclusive-nor gate 215 is logic "1," a circuit failure has occurred because the true signal c[i] and the complement of the true signal $\bar{c}[i]$ are not complements of each other. One skilled in the art will appreciate that other logic gates, functional units or equivalents, such as an exclusive-or gate, can be appropriately used to compare the signals.

Circuit failures are reliably detected by comparing the true signal and the complement of the true signal because errors occur in domino logic gates when the dynamic node is not held at a logic "1" value. Logic "0" to logic "1" misevaluations are common because of, e.g., noise failures. However, logic "1" to logic "0" misevaluations are not caused by noise or other transient phenomena. During the evaluation phase, domino gates either stay at logic "0" or make a logic "0" to logic "1" transition. Domino gates generally do not have issues where the dynamic node is stuck at logic "1" (which makes conditional discharge impossible) because other tests performed on the integrated circuit reveal this problem. Misevaluation failures where the dynamic node is not held at logic "1" occur for a variety of reasons, for example, noise on the input signals or power rails can corrupt the state stored on the dynamic node.

By way of example and with further reference to FIG. 2, suppose true carry signal c[i] is expected to be logic "0," but a circuit error in first logic cone 205 causes c[i] to rise to logic "1." Complement carry signal $\bar{c}[i]$ correctly evaluates and rises to logic "1" because complement carry signal $\bar{c}[i]$ is generated by second logic cone 210. Therefore, the exclusive-nor of the true and complement signals, carry-error signal ce[i], is a logic "1." This indicates that a circuit failure has occurred on the carry-out for the $i^{th}$ bit position because the true and complement carry signals, c[i] and $\bar{c}[i]$ respectively, are the same and not complements of each other. One skilled in the art will appreciate that carry-error signal ce[i] sets an error handling flag or otherwise indicates that a logic cone has a circuit error. Depending on the design process phase (e.g., pre-production or post-production) there are several error handling options including, for example, invalidating the result and re-computing, locating the source of the error, or fixing the error for the production part.

In the above example, distinct logic cones 205, 210 produce the true and complement signals. The circuit failure is undetected if the complement carry signal $\bar{c}[i]$ also has a circuit failure that causes it to stay at logic "0" erroneously. This implies that the dynamic node of the circuit that implemented the complement signal $\bar{c}[i]$ should stay at logic "1." As described above, this type of failure where the dynamic node to be discharged to $V_{SS}$, stays at $V_{DD}$ does not occur in domino gates because other tests performed on the integrated circuit reveal this problem before the integrated circuit is placed into normal operation. Therefore, comparing the true and complement signals produced by distinct logic cones detects at least one circuit failure in the corresponding logic cones.

While it may be advantageous to compare each of the i bit positions of the true carry signal c[i] and complement carry signal $\bar{c}[i]$ to generate carry-error signal ce[i] for each of the i bit positions, one skilled in the art will recognize that in adders with sparse carry chains, there are few carries generated that go into the production of the final sum. Therefore, comparing these few true and complement carries can detect circuit failures in the entire cone of logic that goes into their production. Moreover, if there is a circuit failure, examining which exclusive-nor was a logic "1" pinpoints the logic cone that had the circuit failure. This makes it easier for a circuit designer to debug and to fix the problem.

Figure 3:
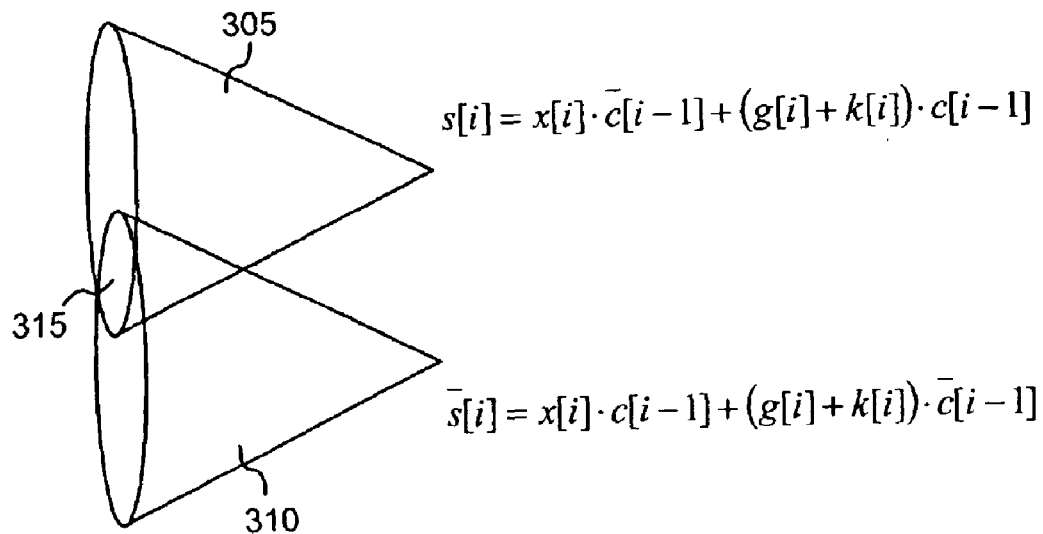
FIG. 3 is a diagram illustrating cones of logic implementing true and complement sum signals.

FIG. 3 is a diagram illustrating cones of logic implementing true and complement sum signals according to an embodiment of the present invention. The system includes a first logic cone 305, a second logic cone 310, and a shared logic cone 315. The first logic cone 305 overlaps with the second logic cone 310 to form the shared logic cone 315. The first logic cone 305 computes the true sum signal s[i] for the $i^{th}$ bit position according to Equation 7, wherein the exclusive-or term x[i] is defined as Equation 8. The second logic cone 310 computes the complement of the sum signal $\bar{s}[i]$ for the $i^{th}$ bit position according to Equation 9.

$$s[i]=x[i]c[i-1]+(g[i]+k[i])c[i-1] \qquad \text{Equation 7}$$

$$x[i]=a[i]\oplus b[i] \qquad \text{Equation 8}$$

$$\bar{s}[i]=x[i]\bar{c}[i-1]+(g[i]+k[i])\bar{c}[i-1] \qquad \text{Equation 9}$$

In the embodiment illustrated in FIG. 3, the shared logic cone 315 represents the common terms in the generation of the true sum signal s[i] and the complement of the sum signal $\bar{s}[i]$. The circuits that generate the true and complement sums have common terms x[i], g[i], and k[i]. Logic cones 305, 310 are, therefore, not distinct. In this embodiment, comparing the true sum signal s[i] and the complement of the sum signal $\bar{s}[i]$ to ensure they are logical complements of each other does not guarantee detection of all circuit errors. This is because an error can occur in shared logic cone 315 that causes both the true sum s[i] and the complement of the true sum $\bar{s}[i]$ to be incorrect, but nevertheless logical complements of each other. Therefore, the shared logic cone 315 can cause aliased errors. That is, comparing the true sum signal s[i] and the complement of the sum signal $\bar{s}[i]$ does not reveal errors in the common circuits in the shared logic cone 315.

Figure 4:
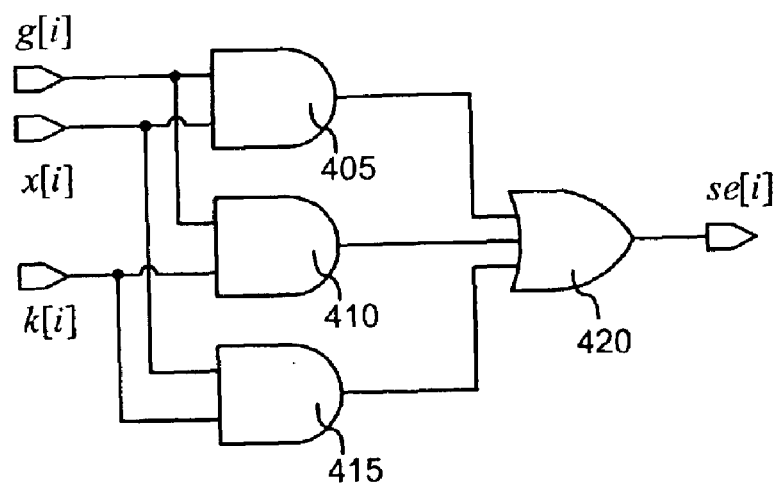
FIG. 4 is a schematic illustrating shared logic cone error detection.

FIG. 4 is a schematic illustrating shared logic cone error detection according to an embodiment of the present invention. The circuit includes a first AND gate 405, a second AND gate 410, a third AND gate 415, and an OR gate 420. The AND gates 405, 410, 415 couple with the OR gate 420 to implement sum of products Equation 10. The first AND gate 405 has as inputs terms g[i] and x[i]. The second AND gate 410 has as inputs terms g[i] and k[i]. The third AND gate 415 has as inputs terms x[i] and k[i]. The output of each of the AND gates 405, 410, 415 are input to the OR gate 420 to produce the shared error signal se[i]. By definition, signals x[i], g[i], and k[i] are one-hot, which means only one of these signals can have a value of logic "1" at any given time. If more than one of these terms has a value of logic "1," a circuit failure has occurred. If there are no errors in the circuits that produce these signals, shared error signal se[i] is has a value of logic "0." If a circuit failure occurs in the shared logic cone 315 (FIG. 3), then shared error signal se[i] outputs a logic "1" value.

The shared error signal se[i] is generated to detect errors in the shared logic cone 315 (FIG. 3). In an adder embodiment, one can detect errors in the common or shared circuits of the shared logic cone 315 (FIG. 3) without explicitly generating true and complement forms of each signal in the shared logic cone and ensuring the true and complement signals are in fact complements. In another embodiment, circuit errors can be detected by decomposing a shared logic cone into distinct logic cones. This embodiment is further described below and with reference to FIG. 5. One skilled in the art will recognize that other functions or equations can be used to find the shared error signal se[i].

$$se[i]=g[i]x[i]+g[i]k[i]+x[i]k[i] \quad \text{Equation 10}$$

As described above and with reference to FIG. 3, comparing the true sum signal s[i] and the complement of the sum signal $\bar{s}[i]$ to ensure they are logical complements of each other does not guarantee detection of all circuit errors because some errors could be aliased by common circuits in the shared logic cone 315 (FIG. 3). In this embodiment, to detect at least one error, the first logic cone 305 and the second logic cone 310 are compared. Concurrently, the overlapping signals in the shared logic cone 315 are checked for aliased errors as described above and with reference to FIG. 4.

Figure 5:
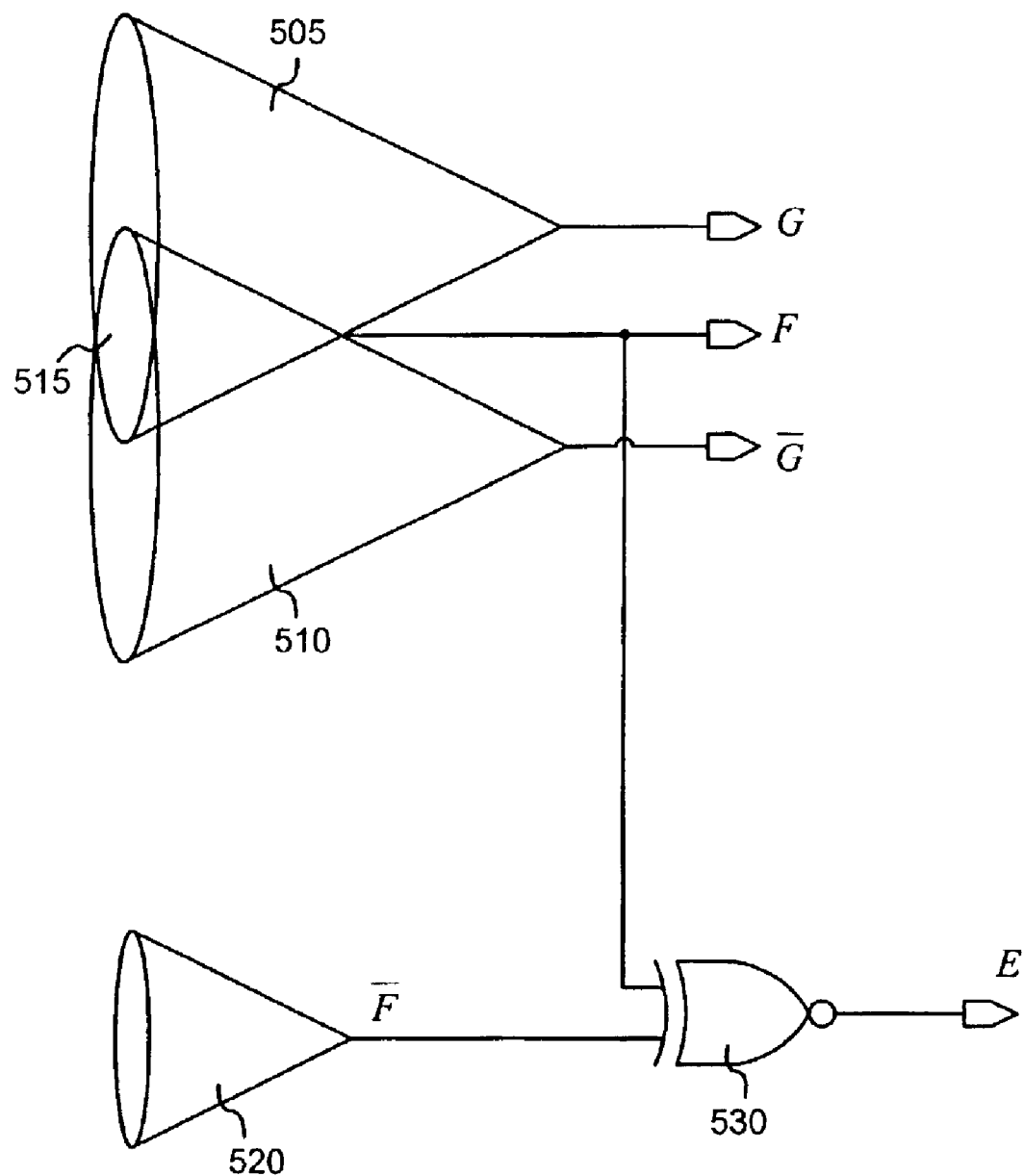
FIG. 5 is a diagram illustrating error detection in function F using distinct cones of logic.

FIG. 5 is a diagram illustrating error detection in function F using distinct cones of logic according to an embodiment of the present invention. The system includes a first logic cone 505, a second logic cone 510, a shared logic cone 515, a third logic cone 520, and an exclusive-nor gate 530. The first logic cone 505 implements a function G, and the second logic cone 510 implements a complementary function $\bar{G}$. The first and the second logic cones 505, 510 overlap to form the shared logic cone 515. The shared logic cone 515 implements a function F, and the third logic cone 520 implements a complementary function $\bar{F}$. The third logic coné 520 includes distinct complement signal circuits to implement function $\bar{F}$. The shared logic cone 515 and third logic cone 520 couple with the exclusive-nor gate 530 to produce an error signal E.

In the illustrated embodiment, the first and the second logic cones 505, 510 are not distinct. As described above, comparing the signals G and $\bar{G}$, produced by the first and the second logic cones 505, 510 respectively, does not guarantee detection of all errors in the circuits of the first and the second logic cones 505, 510. The circuits in the shared logic cone 515 can alias errors and comparing G and $\bar{G}$ to ensure they are complements may not detect the aliased errors. Therefore, by decomposing the circuits in the shared logic cone 515 into a distinct complement signal circuit, one can detect errors in the shared logic cone 515.

As described above, circuit failures are reliably detected by comparing the true signal and the complement of the true signal because errors occur in domino logic gates when the dynamic node is not held at a logic "1" value. Errors in the shared logic cone 515 are detected by comparing signals F and $\bar{F}$, which the shared logic cone 515 and third logic cone 520 produce. In the illustrated embodiment, the exclusive-nor gate 530 compares the signals and outputs an error signal E. The error signal E has a value of logic "1" if F and $\bar{F}$ are not logical complements of each other. That is, a circuit error occurred in either the true signal circuits of the shared logic cone 515 or the complement signal circuits of the third logic cone 520 causing the functions F and $\bar{F}$ to not be complementary signals.

Further, if there are no errors in the shared logic cone 515, the first and the second logic cones 505, 510 implementing functions G and $\bar{G}$ respectively, can be compared to detect errors in the circuits of the first and the second logic cones 505, 510. At least one error in functions G and $\bar{G}$ can be detected by ensuring that G and $\bar{G}$ are in fact complementary signals, and that there are no aliased errors in the shared logic cone 515. As described above, there are no aliased errors when F and $\bar{F}$ are checked and found to be complementary signals. One skilled in the art will appreciate that error detection in the shared logic cone 515 and the first and second logic cones 505, 510 can occur in parallel.

One skilled in the art will appreciate that FIG. 5 illustrates a framework for error detection in dynamic logic circuits. For example, one can detect and pinpoint circuit errors in overlapping logic cones by separately checking the overlapping signals. In an embodiment, one can decompose the overlapping signals into distinct true and complement circuits that can be compared. Although one decomposition is illustrated in FIG. 5, the technique can be iterated for any number of shared logic cones or implementations of logic expressions including common terms.

One skilled in the art will appreciate that the present invention is not limited to adder embodiments and can be applied generally to dynamic logic circuits implementing functional units or other logic functions where error detection is desirable.

The present invention may be embodied in many different forms and should not be construed as limited to the embodiments set forth herein. Rather these embodiments are provided so that this disclosure will be thorough and complete and will fully convey the invention to those skilled in the art. For example, an embodiment of the present invention is error detection in a domino logic adder. The present invention, however, is not limited to adder implementations and the principles described can be appropriately applied to dynamic logic circuits in general.

Having described preferred embodiments of error detection in dynamic logic circuits (which are intended to be illustrative and not limiting), it is noted that modifications and variations can be made by persons skilled in the art in light of the above teachings. It is therefore to be understood that changes may be made in the particular embodiments of the invention disclosed that are within the scope and spirit of the invention as defined by the appended claims and equivalents.

What is claimed is:

1. A method for detecting errors in a domino logic circuit, the method comprising:
    obtaining a true signal in a first logic cone;
    obtaining a complement of the true signal in a second logic cone;
    comparing the true signal and the complement of the true signal, in accordance with an evaluation phase of the domino logic circuit, to determine whether the true signal and the complement of the true signal are logical complements; and
    generating an error signal responsive to the comparing of the true signal and the complement of the true signal, the error signal indicative of a corrupted state stored within a dynamic node of the domino logic circuit.

2. The method of claim 1 wherein the first logic cone is distinct from the second logic cone.

3. The method of claim 1 wherein the true signal and the complement of the true signal are implemented with distinct logic expressions.

4. The method of claim 1 wherein comparing the true signal and the complement of the true signal is through a logic gate configured to generate the error signal.

5. The method of claim 1 wherein comparing the true signal and the complement of the true signal is through a logic exclusive-nor operation.

6. The method of claim 1 wherein comparing the true signal and the complement of the true signal is through a logic exclusive-or operation.

7. The method of claim 1 wherein the error signal is the exclusive-nor of the true signal and the complement of the true signal.

8. The method of claim 1 wherein the first logic cone and the second logic cone overlap forming a shared logic cone.

9. The method of claim 8 further comprising:
decomposing the shared logic cone into distinct true and complement circuits; and
comparing the distinct true and complement circuits to detect an error in the shared logic cone.

10. The method of claim 1, wherein the corrupted state occurs when the dynamic node is discharged improperly during the evaluation phase of the domino logic circuit.

11. An apparatus for detecting errors in a domino logic circuit, the apparatus comprising:
a first logic cone configured to produce a true signal;
a second logic cone configured to produce a complement of the true signal; and
a comparator, operating in a domino logic evaluation phase, and configured to determine whether the true signal and the complement of the true signal are logical complements, the comparator further configured to produce an error signal indicative of the comparator detecting a corrupted state stored within a dynamic node of the domino logic circuit.

12. The apparatus of claim 11 wherein the first logic cone is distinct from the second logic cone.

13. The apparatus of claim 11 wherein the true signal and the complement of the true signal are implemented with distinct logic expressions.

14. The apparatus of claim 11 wherein the comparator is a logic gate configured to generate the error signal.

15. The apparatus of claim 11 wherein the comparator is an exclusive-nor gate.

16. The apparatus of claim 11 wherein the comparator is an exclusive-or gate.

17. The apparatus of claim 11 wherein the error signal is the exclusive-nor of the true signal and the complement of the true signal.

18. The apparatus of claim 11 further comprising a shared logic cone formed by overlapping the first logic cone and the second logic cone.

19. The apparatus of claim 18 wherein the shared logic cone is decomposed into distinct true and complement circuits, the distinct true and complement circuits for detecting an error in the shared logic cone.

20. An apparatus for detecting errors in a domino logic circuit, the apparatus comprising:
means for producing a true signal in a first logic cone;
means for producing a complement of the true signal in a second logic cone;
means for comparing the true signal and the complement of the true signal, in accordance with an evaluation phase of the domino logic circuit, to determine whether the true signal and the complement of the true signal are logical complements; and
means for generating an error signal responsive to a comparison performed by the means for comparing, the error signal indicative of a corrupted state stored within a dynamic node of the domino logic circuit.

21. The apparatus of claim 20 wherein the first logic cone is distinct from the second logic cone.

22. The apparatus of claim 20 wherein the true signal and the complement of the true signal are implemented with distinct logic expressions.

23. The apparatus of claim 20 wherein the means for comparing the true signal and the complement of the true signal is through a logic gate configured to generate the error signal.

24. The apparatus of claim 20 wherein the means for comparing the true signal and the complement of the true signal is through a logic exclusive-nor operation.

25. The apparatus of claim 20 wherein the means for comparing the true signal and the complement of the true signal is through a logic exclusive-or operation.

26. The apparatus of claim 20 wherein the error signal is the exclusive-nor of the true signal and the complement of the true signal.

27. The apparatus of claim 20 wherein the first logic cone and the second logic cone overlap forming a shared logic cone.

28. The apparatus of claim 27 further comprising:
means for decomposing the shared logic cone into distinct true and complement circuits; and
means for comparing the distinct true and complement circuits to detect an error in the shared logic cone.

* * * * *